United States Patent
Raychaudhuri et al.

(10) Patent No.: US 7,309,956 B2
(45) Date of Patent: Dec. 18, 2007

(54) TOP-EMITTING OLED DEVICE WITH IMPROVED-OFF AXIS VIEWING PERFORMANCE

(75) Inventors: Pranab K. Raychaudhuri, Rochester, NY (US); Joseph K. Madathil, Rochester, NY (US); Joel D. Shore, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 300 days.

(21) Appl. No.: 11/036,810

(22) Filed: Jan. 14, 2005

(65) Prior Publication Data

US 2006/0158098 A1 Jul. 20, 2006

(51) Int. Cl.
*H01J 1/62* (2006.01)
(52) U.S. Cl. .................. 313/503; 313/504; 313/506
(58) Field of Classification Search ............. 313/503, 313/498–512
See application file for complete search history.

(56) References Cited

U.S. PATENT DOCUMENTS

| | | | |
|---|---|---|---|
| 4,769,292 A | 9/1988 | Tang et al. | |
| 4,885,211 A | 12/1989 | Tang et al. | |
| 5,645,948 A | 7/1997 | Shi et al. | |
| 5,935,721 A | 8/1999 | Shi et al. | |
| 6,020,078 A | 2/2000 | Chen et al. | |
| 6,208,077 B1 | 3/2001 | Hung | |
| 6,226,890 B1 | 5/2001 | Boroson et al. | |
| 6,420,031 B1 | 7/2002 | Parthasarathy et al. | |
| 6,765,350 B1 | 7/2004 | Burroughes et al. | |
| 2003/0034938 A1* | 2/2003 | Yamada ........................ 345/76 |
| 2003/0178937 A1 | 9/2003 | Mishima | |
| 2004/0249156 A1* | 12/2004 | Kim et al. ..................... 546/2 |
| 2004/0265634 A1* | 12/2004 | Cosimbescu et al. ........ 428/690 |
| 2005/0067946 A1* | 3/2005 | Park ........................... 313/503 |
| 2005/0129979 A1* | 6/2005 | Kambe et al. ............... 428/690 |

OTHER PUBLICATIONS

Handbook of Optical Constants of Solids III, edited by Edward D. Palik, Institute for Physical Science and Technology, Univesity of Maryland, Academic Press, pp. 339-340.
"Ion-beam-induced surface damages on tris-(8-hydroxyquinoline) aluminum" by L. S. Liao et al., Applied Physics Letters, vol. 75, No. 11, Sep. 13, 1999, pp. 1619-1621.
"Metal oxides as a hole-injecting layer for an organic electroluminescent device", by Shizuo Tokito et al., J. Phys. D: Appl. Phys. 29 (1996), pp. 2750-2753.

(Continued)

*Primary Examiner*—Joseph Williams
*Assistant Examiner*—Bumsuk Won
(74) *Attorney, Agent, or Firm*—Raymond L. Owens

(57) ABSTRACT

A top-emitting OLED device with improved off-axis viewing includes a substrate; a reflective, substantially opaque, and conductive anode including a metal or metal alloy or both formed over the substrate; at least one organic layer formed over the anode and including an electroluminescent material; a cathode including a semitransparent metallic layer provided over the organic layer wherein the semitransparent metallic layer includes a low reflectivity metal; an light transmissive layer provided over the cathode; and the cathode and light transmissive layer being selected to reduce the color shift with respect to an off-axis viewing angle.

23 Claims, 7 Drawing Sheets

OTHER PUBLICATIONS

"A metal-free, full-color stacked organic light-emitting device" by G. Gu et al., Applied Physics Letters, vol. 74, No. 2, Jan. 11, 1999, pp. 305-307.

"Transparent stacked organic light emitting devices. I. Design principles and transparent compund electrodes" by G. Gu et al., Journal of Applied Physics, vol. 86, No. 8, Oct. 15, 1999, pp. 4067-4075.

"Active textured metallic microcavity" by H. L. Tam, et al., Proceedings of the 7th Asian Symposium on Information Display (ASID '02) ISBN: 981-04-6983-7, pp. 453-456, no date.

"1.3: Performance enhancement of top- and bottom-emitting organic light-emitting devices using microcavity structures", by P. K. Raychaudhuri et al., Research and Development Laboratories, Eastman Kodak Company, ISSN 1083-1312/00/2003-0010, no date.

"Control of emission characteristics in organic thin-film electroluminescent diodes using an optical-microcavity structure" by Noriyuki Takada et al., Appl. Phys. Letter 63 (15), Oct. 11, 1993, pp. 2032-2034.

"Phosphorescent top-emitting organic light-emitting devices with improved light outcoupling" by H. Riel et al., Applied Physics Letters, vol. 82, No. 3, Jan. 20, 2003, pp. 466-468.

"High-efficiency top-emitting organic light-emitting devices" by M.-H. Lu et al., Applied Physics Letters, vol. 81, No. 21, Nov. 18, 2002, pp. 3921-3923.

* cited by examiner

TOP-EMITTING OLED DEVICE WITH IMPROVED-OFF AXIS VIEWING PERFORMANCE

FIELD OF THE INVENTION

The invention relates to a top-emitting organic light-emitting diode device having metallic electrodes with improved off-axis viewing.

BACKGROUND OF THE INVENTION

An organic electroluminescent (OEL) device, alternately known as organic light emitting diode (OLED), is useful in flat-panel display applications. This light-emissive device is attractive because it can be designed to produce red, green, and blue colors with high luminance efficiency; it is operable with a low driving voltage on the order of a few volts, and clearly viewable from oblique angles. These unique attributes are derived from a basic OLED structure comprising of a multilayer stack of thin films of small-molecule organic materials sandwiched between an anode and a cathode. Tang et al in commonly-assigned U.S. Pat. Nos. 4,769,292 and 4,885,211 have disclosed such a structure. The common electroluminescent (EL) medium is comprised of a bilayer structure of a hole-transport (HTL) layer and an electron-transport layer (ETL), typically on the order of a few tens of nanometer (nm) thick for each layer. When an electrical potential difference is applied at the electrodes, the injected carriers-hole at the anode and electron at the cathode-migrate towards each other through the EL medium and a fraction of them recombines in the emitting layer (EML) a region close to the HTL/ETL interface, to emit light. The intensity of electroluminescence is dependent on the EL medium, drive voltage, and charge injecting nature of the electrodes. The light viewable outside of the device is further dependent on the design of the organic stack and optical properties of the substrate, anode and the cathode.

Conventional OLEDs are bottom emitting (BE), meaning that the display is viewed through the substrate that supports the OLED structure. The devices normally employ transparent glass substrates having a layer of highly transparent indium-tin-oxide (ITO) layer that also serves as the anode. The cathode is typically a reflective thin film of MgAg, although lithium-containing alloys are also used as an efficient electron-injecting electrode. The light generated within the device is emitted in all directions. However, only a small fraction of generated light is available for viewing, and about 80% of generated light is trapped within the device in waveguiding modes in glass, ITO and organic layers. The light emitted toward the anode at less than the critical angle passes through the anode and through the substrate to the viewer, and the light emitted in the opposite direction is reflected at the cathode and passes through the substrate, enhancing the viewing intensity. A transparent substrate, a high-transparency anode and a high-reflectivity cathode are required to yield high luminance efficiency devices.

The OLED display is typically coupled with active matrix (AM) circuitry in order to produce high performance displays. For the AM bottom emitting display, which uses switching elements of thin film transistors, the transistors are fabricated on glass substrates. Consequently the open area available for the light to emerge is reduced. With the application of multi-transistor and complex circuitry in the backplane the open area through which the light emerges is reduced. The ratio of the open area to that of the entire display area is called the aperture ratio. Due to the reduction of the aperture ratio the display will run dim. To compensate for the reduced average brightness level the drive current has to be increased subjecting the display to increased risk of operational degradation. It follows that more complex pixel drive circuitry cannot be readily implemented without further compromising the aperture ratio and the operational stability.

To alleviate this problem the emitted light can be made to emerge through the top surface. In the top-emitting design the drive circuitry is fabricated on substrate and the light emerges through the opposite surface. This design permits the use of complex circuitry occupying whatever substrate space is needed and the light-emitting area of the cathode and hence the aperture ratio is not affected. The high aperture ratio makes the display viewable consuming less power. The devices have the prospect of running at low drive current while maintaining readability and extending their operational life.

Devices employing opaque backplanes such as silicon the OLED must be of the top-emitting type. The top surface, usually the cathode, needs to be at least semitransparent in order to allow the light to exit through the top. The device should preferably include a reflector or a reflecting anode opposite to the cathode side to redirect the light that strikes the anode to the cathode side.

Any device design should be aimed at achieving highest possible efficiency. However, realizing high efficiency by reclaiming light lost to waveguiding modes can be very difficult. To recover even a fraction of light lost to the waveguiding modes the device architecture can be very complex.

An approach to enhance the efficiency without introducing such complexity is to implement a microcavity design for the device, which includes reflecting electrodes. By employing highly reflective electrodes it is possible to remarkably increase the out-coupling of generated light. Sony Corporation (EP 1 154 676 A1) has disclosed an anode made of light-reflecting materials such as Pt, Au, Cr, W, or presumably other high-work function materials in conjunction with an optional buffer/hole-injecting layer (HIL). Sony also has disclosed (EP 1 102 317 A2) that an anode composed of a transparent conducting film such as ITO formed on the reflecting layer. The top electrode was a semitransparent reflecting layer of MgAg or Al:Li alloy serving as the cathode through which the light emerges. Lu et al. ("High-efficiency top-emitting organic light-emitting devices", M.-H. Lu, M. S. Weaver, T. X. Zhou, M. Rothman, R. C. Kwong, M. Hack, and J. J. Brown, Appl. Phys. Lett. 81, 3921 (2002)) disclosed a top-emitting, highly efficient OLEDs that used reflective metals in the anode structure, a phosphorescent emissive layer, $Ir(ppy)_3$, and a semitransparent compound cathode. Riel et al. ("Phosphorescent top-emitting organic light-emitting devices with improved light outcoupling", H. Riel, S. Karg, T. Beierlein, B. Rushtaller, and W. Rieb, Appl. Phys. Lett. 82, 466 (2003) demonstrated a high-efficiency top emitter, also using the $Ir(ppy)_3$ emissive layer, high work-function metal anodes, and semitransparent metal cathodes and further employing a ZnSe capping layer over the semitransparent compound cathode for improved light outcoupling. These top-emitters demonstrated efficiencies that are higher than the equivalent bottom-emitting non-microcavity devices.

Although microcavity devices can be highly efficient, the emission from microcavity devices is characteristically directional. The microcavity device can cause color distortion when viewed at oblique angles. The emission shifts to shorter wavelength and the intensity falls rapidly with viewing angle ("Control of emission characteristics in organic thin film electroluminescent diodes using an optical microcavity structure" N. Takada, T. Tsutsui, and S. Saito Appl. Phys. Lett. 63 (15) 2032 (1993)). It is shown that for a device with a reflective MgAg electrode and a semitransparent Ag electrode the peak wavelength shifted progressively toward the shorter wavelength side with increasing detection angle. The shift in peak wavelength at 45 degree was reported to be about 50 nm at a detection angle of 45 degree whereas a comparable non microcavity device exhibited negligible wave length shift. The microcavity devices thus are expected to exhibit significant color change with viewing angle. Raychaudhuri et. al. ("Performance enhancement of bottom-and top-emitting organic light-emitting devices using microcavity structures", P. K. Raychaudhuri*, J. K. Madathil, Joel D. Shore and Steven A. Van Slyke, Proceedings of the 23 rd International Display Research Conference, Phoenix, Ariz., Sep. 16 to 18, 2003, p 10) discussed monochrome microcavity devices that are twice as efficient as optimized bottom-emitting non-microcavity devices and exhibiting negligible wavelength shift with viewing angle. The thickness of the hole-transport layer, and hence the cavity length was very precisely adjusted to minimize the angular dependence. Such tight thickness control in manufacturing is difficult and may be practically unattainable.

Tam et. al ("Active Textured Metallic microcavity" H. L. Tam, R. Huber, K. F. Li, W. H. Wong, Y. B. Pun, S. K. So and K. W. Cheah, Proceedings of the $7^{th}$ Asian Symposium on Information Display (ASID 02) Singapore 2002, p 453) discussed a textured metallic microcavity having a two-dimensional wavelength scale periodic structure with nanometer precision. On a plane semitransparent Ag electrode a periodic pattern was created by electron-beam lithography upon which an emitter and the semitransparent Ag electrode was deposited in sequence resulting in a microcavity structure with a textured mirror. Their results from angle resolved transmission experiments show that the photo luminescence (PL) peak shifts with the viewing angle from the textured microcavity is less when compared with that from a planar microcavity sample. This type of device structure in manufacturing environment is most likely undesirable.

A top-emitting planar microcavity OLED is expected to exhibit color distortion with viewing angle. A semitransparent metallic cathode can have sufficient residual reflection to cause microcavity effect that distorts the emission color. ("Transparent stacked organic light emitting devices. I. Design principles and transparent compound electrodes", G. Gu, G. Parthasarathy, P. E. Burrows, P. Tian, G. Hill, A. Kahn, and S. R. Forrest, Appl. Phys. Lett. 86 (8) 4067 (1999)). However when a highly transparent metal free cathode of indium-tin-oxide (ITO) was substituted for the semitransparent cathode the angular dependence of emission colors due to microcavity effect became weak. ("A metal-free full-color stacked organic light-emitting device", G. Gu, G. Parthasarathy, and S. R. Forrest, Appl. Phys. Lett. 74 (2) 305 (1999)).

In top-emitting OLED the top electrode, usually a cathode, includes a low work function metal or a metal on an electron-injecting surface. To achieve high efficiency the transparency of the cathode needs to be high requiring the use of thinnest possible layer. But such thin films are not sufficiently electrically conductive making the implementation in large display difficult because of the greater distance that the current must travel. A capping layer of conductive and highly transparent material is needed to increase lateral electrical conductivity without significantly decreasing the light output. Additionally, the capping layer helps to preserve the integrity of the cathode. Indium tin oxide (ITO) is the most commonly used transparent conducting oxide (TCO). However, deposition methods for this material are not compatible with that of the organic layers of OLEDs. Deposition methods for TCOs generally involve sputter deposition. Sputtering is a preferred method as it permits optimization of the film composition during film deposition for maximization of transparency and conductivity. However, sputtering deposition directly on the electron transport layer (ETL) can result in degraded device performance. An Ar plasma commonly employed in sputtering is known to cause severe degradation of Alq, a widely used electron transport material. ("Ion-beam induced surface damages on tris-(8-hydroxyquinoline) aluminum", L. S. Liao, L. S. Hung, W. C. Chan, X. M. Ding, T. K. Sham, I. Bello, C. S. Lee, and S. T. Lee, Appl. Phys. Lett. 75, 1619 (1999)). This damage reduces the intensity of the emission and may additionally permanently damage the pixels. Thus, it is necessary to protect the ETL during sputtering deposition of TCOs, and thin cathode layer, typically of the order of 10-nm may not be adequately effective.

In U.S. Pat. No. 6,420,031, assigned to The Trustees of Princeton University, a class of low reflectivity, high transparency, non-metallic cathodes useful for a wide range of electrically active, transparent organic devices is disclosed. The representative embodiment of this invention employs ITO as the electrically conductive non-metallic layer and a phthalocyanine compound such as ZnPc or CuPc as the electron-injecting interface layer. The low-resistance electrical contact is formed when the ITO is deposited onto the organic layer. The CuPc layer functions as: 1) a protection layer, preventing damage to the underlying organic layers during the ITO sputtering process; and 2) an electron-injecting region, functioning in combination with the ITO layer to deliver electrons to the adjacent electron transporting layer. This solution for delivering a highly transparent cathode for use in an OLED is insufficient as the buffer materials may be unsuitable for full color devices.

SUMMARY OF THE INVENTION

It is therefore an object of the present invention to provide an OLED device with improved off-axis viewing.

These objects are achieved by an OLED device capable of emitting light through the top electrode of such device comprising:

(a) a substrate;

(b) a reflective, substantially opaque, and conductive anode including a metal or metal alloy or both formed over the substrate;

(c) at least one organic layer formed over the anode and including an electroluminescent material;

(d) a cathode including a semitransparent metallic layer provided over the organic layer wherein the semitransparent metallic layer includes a low reflectivity metal;

(e) a light-transmissive layer provided over the cathode; and (f) the cathode and light-transmissive layer being selected to improve off-axis viewing.

It is an advantage of this invention that it reduces the microcavity effects and thereby produces an TE-OLED with less distortion of color with respect to viewing angles. It is a further advantage of the invention that efficiency of top-emission is enhanced.

BRIEF DESCRIPTION OF THE DRAWINGS

FIG. 2b shows the experimentally determined angular dependence of emission of an OLED having the same structure as the device of FIG. 2a;

FIG. 3b shows the experimentally determined angular dependence of emission of an OLED having the same structure as the device of FIG. 3a;

DETAILED DESCRIPTION OF THE INVENTION

Throughout the ensuing description acronyms are used to designate the names of the different organic layers and operating features of organic light-emitting devices. For reference they are listed in Table 1

TABLE 1

| | |
|---|---|
| OLED | Organic light-emitting diode |
| ITO | Indium tin oxide |
| HIL | Hole-injection Layer |
| HTL | Hole-transport layer |
| EML | Emissive layer |
| ETL | Electron-transport layer |
| LTL | Light transmissive layer |
| NPB | 4,4'-Bis[N-(1-naphthyl)-N-phenylamino]biphenyl (NPB) |
| Alq | Tris(8-hydroxyquinoline) aluminum |
| TCO | Transparent conductive oxide |
| CuPc | Copper phthalocyanine |
| ZnPc | Zinc phthalocyanine |
| MgAg | Mg (95 v %):Ag (5 v %) alloy |

Figure 1:
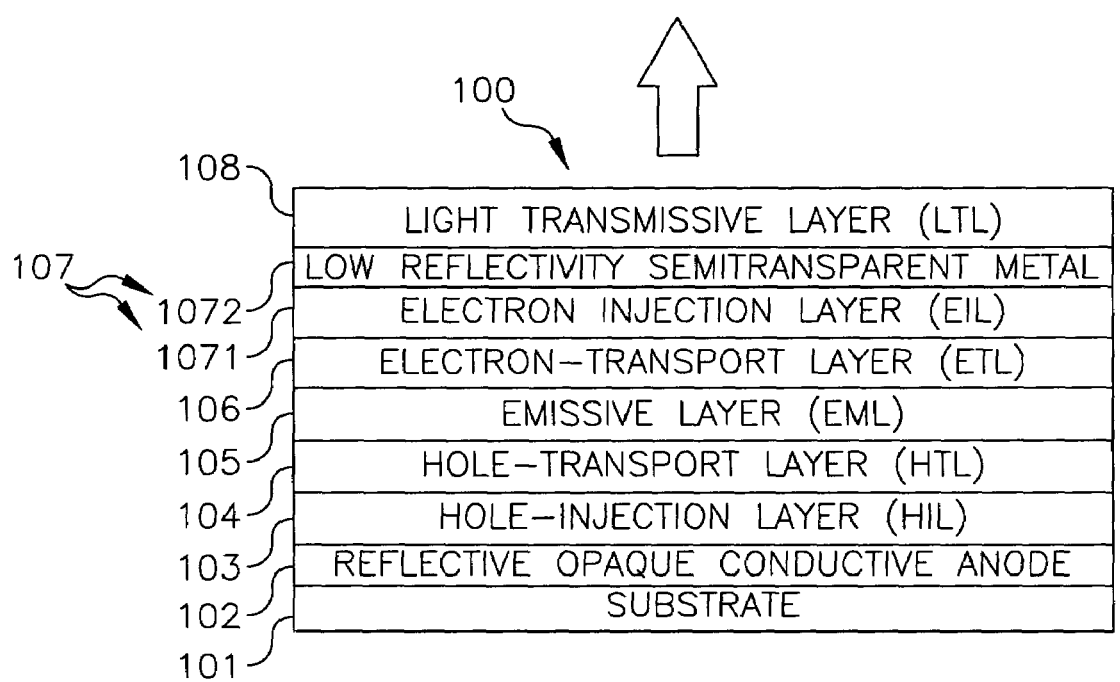
FIG. 1 shows schematically the layer structure of an OLED of the present invention.

Turning to FIG. 1, the OLED 100 is top-emitting OLED device of the present invention (Inventive OLED), which includes a transparent or opaque substrate 101, a reflective, opaque and conductive anode 102, a hole-injection layer (HIL) 103, a hole-transport layer (HTL) 104, an emissive layer (EML) 105, an electron-transport layer (ETL) 106, and a semitransparent and conductive cathode 107, and a light transmissive layer (LTL) 108. The cathode 107 can include an electron injection layer (EIL) 1071 including a material having a work function of about 4.0 eV or less and further includes a semitransparent layer 1072 having a low reflectivity metallic metal. The cathode 107 is alternately termed as the cathode structure. In operation, the anode 102 and any conductive layer of the cathode structure 107 are connected to a voltage source and electrical current is passed through the organic layers, resulting in light generation in the emissive layer 105. The intensity of generated light is dependent on the luminescent and electrical characteristics of the organic layers as well as the charge-injecting natures of the anode 102, the hole-injection layer 103, and the cathode structure 107 and the magnitude of the electrical current passed through the OLED 100. A part of the generated light is emitted through the cathode structure 107 in the direction shown by the arrow. The emission viewable from the top surface is further dependent on the reflectance of the anode 102, the layer structure of the OLED and the transmittance of the cathode structure 107.

The composition and the function of the various layers constituting the OLED device are described as follows.

Substrate 101 (FIG. 1) may include any substrate, opaque, semitransparent or transparent including glass, ceramic, metal, alloy, plastics or semiconductor as the light emits through the surface opposite to the substrate 101. The substrates 101 may take the form of rigid plate, flexible sheet, or curved surfaces. Since the OLED device fabrication does not require high temperature process, any material that can withstand process temperatures on the order of 100° C. is useful as substrates 101. Substrate 101 may include support with electronic backplane, and thus includes active-matrix substrates, which contain electronic addressing and switching elements. Active-matrix substrates can contain high temperature polysilicon thin-film-transistors, low temperature polysilicon thin-film-transistors or amorphous silicon thin film transistors. Those skilled in the art will appreciate that other circuit elements can be used to address and drive the pixels of an OLED device.

Anode 102 (FIG. 1) provides the function of injecting holes into the organic layer when a positive potential relative to the cathode 107 is applied. The anode materials typically include high work function metals such as Au, Pd, Pt or the like and their alloys. The anodes can also serve as the reflectors. The anode layer should be thick, preferably thicker than 40 nm, to make them sufficiently reflective, substantially opaque and reasonably conductive. By opaque it is meant that the transmission of an anode film on glass is less than 10% and sufficiently reflective means that the reflectivity is at least 70% of that of the bulk material. Although high reflectivity anode metals are preferred, the anode layer can include any of the following metals: Ag, Al, Mg, Zn, Rh, Ru, Ir, Au, Cu, Pd, Ni, Cr, Pt, Co, Te, Mo, Hf, Fe, Mn, Nb, Ge, Os, Ti, V or W, or alloys or mixtures thereof. The anode layers can be fabricated by any deposition method including sputtering or evaporation and may also be compatible with the manufacturing process for the OLED 100. The anode including the materials may or may not need an overlying hole-injection layer 103.

Hole-injection layer 103 (FIG. 1) provides the function of increasing the efficiency of the hole-injection from the anode 102. It has been shown in commonly assigned U.S. Pat. No. 6,208,077 that a layer of plasma polymerized fluorinated carbon is useful as a hole injection layer. The hole-injection layer results in OLEDs with reduced operating voltage, increased luminance efficiency and enhanced operational stability. The fluorinated carbon hole-injection layer includes $CF_x$, wherein x is less than or equal to 3 and greater than 0. The method of preparation and the characteristics of $CF_x$ have been disclosed in the commonly assigned U.S. Pat. No. 6,208,077. Some oxide hole injecting materials were found to provide a function similar to those of the CFx. The oxide hole-injecting layers can include oxides of Mo, V or Ru. A layer of these materials each about 30 nm thick on 120 nm thick ITO on glass has been found useful in bottom-emitting non-microcavity OLEDs as a hole injector to TPD, an hole-transport layer ("Metal oxides as a hole-injecting layer for an organic electroluminescent device", S. Tokito, K. Noda and Y. Taga, J. Phys. D; Appl. Phys. 29, 2750 (1996)). The MoO$_3$ was prepared by sputtering. An ITO layer on Ag reflector has been used to enhance hole injection from the anode that would not presumably allow efficient hole injection to the HTL directly from the Ag. ("High-efficiency top-emitting organic light-emitting devices", M.-H. Lu, M. S. Weaver, T. X. Zhou, M. Rothman, R. C. Kwong, M. Hack, and J. J. Brown, Appl. Phys. Lett. 81, 3921 (2002)). A hole-injecting layer including CFx or an oxide provides efficient hole injection from many metal anodes yielding OLEDs with high efficiency. Even high work function metals that are believed efficient hole injectors were benefited from a hole-injecting layer. ("Performance Enhancement of Top- and Bottom-Emitting Organic Light-Emitting Devices Using Microcavity Structures", P. K. Raychaudhuri, J. K. Madathil, Joel D. Shore, and Steven A. Van Slyke, Proceeding of the 23$^{rd}$ International Display Research Conference, Phoenix, Ariz., USA, Sep. 15-19, 2003, p 10)). The CFx was prepared by decomposition of CHF$_3$ gas in RF plasma. The MoO$_x$ layer was prepared by vacuum evaporation of MoO$_3$ and the deposited film can was non-stoichiometric having the composition represented by MoO$_x$ wherein x is less than 3 but greater than 2. The HIL depending on the conductivity and transparency is usable up to several tens of nanometers. The hole injectors for the metallic anodes can include CF$_x$, ITO, IZO, Pr$_2$O$_3$, TeO$_2$, CuPc, SiO$_2$, VO$_x$, MoO$_x$, or Ru$_2$O$_3$ or mixtures thereof.

Hole-transport layer 104 (FIG. 1) provides the function of transporting holes to the emissive layer 105. Hole-transport materials include various classes of aromatic amines as disclosed in commonly assigned U.S. Pat. No. 4,720,432. A preferred class of hole-transport materials includes the tetraaryldiamines of formula (I).

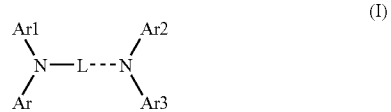

wherein:
Ar, Ar1, Ar2 and Ar3 are independently selected from among phenyl, biphenyl and naphthyl moieties;
L is a divalent naphthylene moiety or d$_n$;
d is a phenylene moiety;
n is an integer of from 1 to 4; and
at least one of Ar, Ar1, Ar2 and Ar3 is a naphthyl moiety.

Useful selected (fused aromatic ring containing) aromatic tertiary amines are the following:
4,4'-Bis[N-(1-naphthyl)-N-phenylamino]biphenyl (NPB)
4,4"-Bis[N-(1-naphthyl)-N-phenylamino]-p-terphenyl
4,4'-Bis[N-(2-naphthyl)-N-phenylamino]biphenyl
1,5-Bis[N-(1-naphthyl)-N-phenylamino]naphthalene
4,4'-Bis[N-(2-pyrenyl)-N-phenylamino]bi-phenyl
4,4'-Bis[N-(2-perylenyl)-N-phenylamino]biphenyl
2,6-Bis(di-p-tolylamino)naphthalene
2,6-Bis[di-(1-naphtyl)amino]naphthalene Thickness of the HTL is chosen to maximize the luminance and its selection is dependent on the optical stack comprising the device. Both electrodes of the device of the present invention are metallic and substantially reflective; the optical path length from the emissive zone to the electrodes is to be chosen following a microcavity model (FIG. 1) The distance between the emissive zone and the anode, which is very approximately the thickness of the HTL layer is selected to be 30 to 80 nm or 160 to 230 nm. As an Alq layer, 60 nm thick, can be chosen as the EML/ETL, the distance between the two electrodes is 90 to 140 nm or 220 to 290 nm, and hence the total thickness of organic layers is 90 to 140 nm or 220 to 290 nm.

Emissive layer 105 (FIG. 1) provides the function of light emission produced as a result of recombination of holes and electrons in this layer. A preferred embodiment of the emissive layer includes a host material doped with one or more fluorescent dyes. Using this host-dopant composition, highly efficient OLED devices can be constructed. Simultaneously, the color of the EL devices can be tuned by using fluorescent dyes of different emission wavelengths in a common host material. Tang et al. in commonly assigned U.S. Pat. No. 4,769,292 has described this dopant scheme in considerable detail for OLED devices using Alq as the host material. As set forth in the Tang et al. commonly assigned U.S. Pat. No. 4,769,292, the emissive layer can contain a green light-emitting doped material, a blue light-emitting doped material, or a red light-emitting doped material.

Preferred host materials include the class of 8-quinolinol metal chelate compounds with the chelating metals being Al, Mg, Li, Zn, for example. Another preferred class of host materials includes anthracene derivatives such as 9,10 dinaphthyl anthracene; 9,10 dianthryl anthracene; and alkyl substituted 9,10 dinaphthyl anthracene, as disclosed in Shi et al. commonly assigned U.S. Pat. No. 5,935,721.

Dopant materials include most fluorescent and phorphorescent dyes and pigments. Preferred dopant materials include coumarins such as coumarin 6, dicyanomethylenepyrans such as 4-dicyanomethylene-4H pyrans, as disclosed in Tang et al. commonly assigned U.S. Pat. No. 4,769,292 and in Chen et al. in commonly assigned U.S. Pat. No. 6,020,078.

Electron-transport layer 106 (FIG. 1) provides the function of delivering electrons injected from the cathode to emissive layer 105. Useful materials include Alq, benzazoles, as disclosed in commonly assigned Shi et al. commonly assigned U.S. Pat. No. 5,645,948.

The cathode 107 (FIG. 1) provides the function of injecting electrons into the ETL 106 when a negative potential relative to the anode 102 is applied. The cathode materials typically have low work function metals including alkali metals, alkaline earth metals, rare earth metals or any metals whose work functions are 4.0 eV or less. The cathode should preferably be highly transparent in order for the generated light to emit through the cathode with no significant absorption in the cathode layer. Transparent material such as ITO in single layer may not inject electron efficiently to the organic layer. A bilayer structure having a thin metallic layer and a layer of a transparent conductive material such as a TCO can be used to meet both functions of electron injection and light transmission. A semitransparent cathode structure can include a thin, 10-nm MgAg film as the electron injecting layer and an overlying ITO TCO layer to increase the conductivity. U.S. Patent Application Publication No. 2003/0178937 discloses a transparent cathode including a thin layer of a metal with work function less than 4.5 eV and a TCO layer. Also disclosed is another transparent cathode consisting of a sputter deposited TCO layer on a thin LiF/Al structure.

In the bilayer configuration of the cathode structure of the OLED of the present invention, the layer 1071 (FIG. 1) which is in contact with the ETL layer 106 comprises metallic materials having a work function selected to be about 4.0 eV or less. Mg and Li containing alloys are generally used because they have low work functions and make efficient electron-injecting contacts to ETL. Alternately, the layer 1071 can be formed as a thin and effectively transparent electron injecting layer by depositing an ultrathin layer of an alkali or alkaline earth metal or combinations thereof, or by depositing a compound of an electron injecting dopant material including LiF on the Alq ETL and a thin layer of a reactive metal including Al or Mg. The surface allows the use of virtually any metal, metal alloy or even non-metallic conductors regardless of work function and to yield cathode structure with desired properties.

In microcavity OLEDs metallic electrodes are generally preferred to meet the requirements of electrical conductivity and light transmission. To realize high efficiency a highly reflective opaque anode and a low absorption reflective cathode are needed. Ag is preferred for both anode and cathode as it meets the requirements very appropriately. The bulk reflectivity of Ag is greater than 90% at 550 nm. However in accordance with the present invention the cathode includes a metal, the bulk reflectivity of which is about 50% or less. These low reflectivity metals include rare earth metals, Sc, Y, Ge, Os, Rh, Se, Si, Ta, Ti, V, W or Zr or alloys thereof. In accordance with the present invention, the cathode layer 107 (FIG. 1) is semitransparent, relatively thick and conductive. The transmittance of the cathode 107 is preferably greater than 25% and its lateral resistivity is preferably few tens of ohms/sq or less. The cathode structure can include two layers. For the low work function metals the layer 1071 is not required and the cathode 107 can include only one layer, layer 1072, having a low work function, low reflectivity metal including Yb or alloys thereof. Commonly assigned U.S. Pat. No. 6,765,350 discloses a trilayer cathode structure including a metal with a work function of less than 3.5 eV including Yb in either of the two layers next to the organic layer. However the cathode is not transparent and no reference is made to its utility other than being an electron injector. To include a low reflectivity and relatively high work function metallic layer in the cathode, the electron injecting layer 1071 is essential and low reflectivity and high work function metallic materials such as Ti, Zr etc. make up the layer 1072. In order for the light to pass through top surface, the cathode should be semitransparent By semitransparent it is meant that the transmittance a film on glass is 20% or more over the visible wavelength range. Depending on the metals or alloys selected the thickness of the cathode 107 (FIG. 1) can be greater than about 8 nm but less than about 50 nm.

Light transmissive layer (LTL) 108 of the OLED 100 (FIG. 1) is preferably a highly transmissive film that provides the function of improving off-axis viewing and to enhance the viewing intensity. Since the cathode 107 (FIG. 1) is continuous, being relatively thick, and also conductive the LTL does not have to be conductive. The LTL materials include conductive or nonconductive, inorganic or organic materials including but not limited to metal oxides, metal nitrides, metal fluorides, metal carbides or metal borides or mixtures thereof. The LTL may also have organic materials including Alq or NPB or both. The organic LTL deposition is readily done, the deposition process being compatible with that of the organic layers of the OLED. Inorganic oxides that are evaporable at temperature accessible to resistive heating can be deposited by thermal evaporation. Some oxides may partially decompose in high vacuum during evaporation and may require small amount of added oxygen in the environment to preserve the stoichiometry. The fluorides of Mg, Li, Ca etc., can be thermally evaporated as many of them evaporate congruently. Heating to high temperatures using electron beam can evaporate many low-vapor pressure metal oxides. Sputtering is preferred for oxides, nitrides, carbides, and borides as the sputtered film has generally the same composition as the source material (target materials) and unlike the evaporation methods films can be deposited from any target materials regardless of vapor pressure. One of the widely used transparent conductive oxides is ITO. Deposition method for ITO generally involves sputtering. However, sputtering can be damaging to the electron transport layer (ETL) within OLED devices. ("Ion-beam induced surface damages on tris-(8-hydroxyquinoline) aluminum", L. S. Liao, L. S. Hung, W. C. Chan, X. M. Ding, T. K. Sham, I. Bello, C. S. Lee, and S. T. Lee, Appl. Phys. Lett. 75, 1619 (1999)). However metallic cathodes of the present invention can include robust metals that can act as a buffer allowing deposition of ITO with no discernible degradation of the device performance. The primary function of the ITO layer used in our invention, unlike the previous top-emitting devices, is not to increase the conductivity of the cathode structure. The thickness of the LTL layer including the ITO and other light transmissive layer is selected to reduce off-axis color shift and to improve luminance efficiency.

Most OLED devices are sensitive to moisture or oxygen or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as $SiO_x$, Teflon, and alternating inorganic/polymeric layers are known in the art for encapsulation.

OLED devices of this invention can employ various well-known optical effects in order to enhance their properties if desired. This includes optimizing layer thicknesses to yield maximum light transmission, replacing reflective electrodes with light-absorbing electrodes to enhance contrast, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over the cover or as part of the cover.

EXAMPLES

The TE-OLED of the present invention (Inventive OLED) was fabricated on glass substrate, which was previously coated with a patterned layer of Ag. The silver was deposited through a shadow mask by sputtering in Ar atmosphere forming the reflective, substantially opaque and conductive anode. A top-emitting microcavity OLED (MC-OLED) was also made using the same anode. A bottom-emitting OLED was also made on an ITO coated glass substrate as a reference device (REF. OLED). The anodes of all the devices were provided with a hole-injection layer (HIL) either of $CF_x$ or of $MoO_x$. The $CF_x$ layer was about 1 nm thick and was deposited by decomposing $CHF_3$ gas on the anode surface in RF plasma. The $MoO_x$ layer, typically 2.5 nm thick, was deposited by evaporating $MoO_3$ from a resistively heated boat in high vacuum. The organic stack including NPB HTL, and Alq EML/ETL was vacuum deposited at a pressure of $\sim 1\times 10^{-6}$ Torr through a mask having a circular opening 1.7 cm in diameter. The metallic cathode was deposited on the ETL layer also by evaporation through a square mask, which defined an active area of 0.1 cm² for the OLED. The cathode structure for the MC-OLED includes, in sequence, a layer of 0.5 nm thick Li, a layer of Ag about 20 nm thick, and a layer of a light-transmissive material (LTL). The cathode structure in accordance with this invention, includes a layer of low reflectivity metal and a LTL deposited on the metal layer. The metal layers were deposited from resistively heated boats, whereas the LTL was either evaporated or sputtered. The cathode structures of the MC OLED and Inventive OLED are semitransparent allowing the light to pass through the top cathode.

The cathode of the REF. OLED is opaque and highly reflective and the light passes through the ITO coated glass substrate. The TE diodes (MC OLED and Inventive OLED) were hermetically encapsulated in dry nitrogen atmosphere using a cover glass and leaving a gap between the cathode and the cover glass. The REF. OLED was encapsulated by placing an opaque metal can on the cathode side. The luminance of the diodes was determined using a Photo Research PR650 spectroradiometer as a function of current. The drive voltage and luminance given here are those obtained when a current corresponding to 20 mA/cm$^2$ was passed through the diode. The voltage drop caused by series resistance of the Ag anode in MC OLED and Inventive OLED is negligible; and that caused by the ITO anode layer in the REF. OLED is significant. Therefore the voltage drop in the ITO anode was subtracted from the measured drive voltage in order to compare the devices on the basis of their "true" drive voltages.

The spectral radiance as a function of detection angle starting from 0° (on-axis i.e., normal to the device surface) to 70° off-axis was also measured under the condition of 20 mA/cm$^2$ drive current to determine the emission peak-shift with viewing angle

Example 1

A REF. OLED, device 2A, was made on a glass substrate having a 70 ohm/sq ITO layer as the anode. A MC-OLED, device 2B, was fabricated on glass substrate having a high reflectivity anode layer of Ag. Each of the devices has identical EML/ETL and the structures were optimized for maximization of light emission. The device 2B has a semitransparent Ag cathode and a LTL of Alq on the Ag cathode. Thus, device 2B is a MC-OLED both electrodes of which constituted of a high reflectivity metal. The devices have the following layer structures:

2 A: Glass (1.1 mm)/ITO (42 nm)/CF$_x$ (1 nm)/NPB (115 nm)/Alq (60 nm)/MgAg (22 nm)—(PR040830-1A)

2 B: Glass (1.1 mm)/Ag (80 nm)/MoO$_x$ (2.5 nm)/NPB (45 nm)/Alq (60 nm)/Li (0.5 nm) Ag (20 nm)/Alq (80 nm)—(PR040817-1F)

The performance of the diodes including the shift of emission wave length with viewing angle (angular characteristic) is presented in Table 2:

TABLE 2

| Device | Device Type | Drive voltage (V) | Efficiency (cd/A) on-axis (0°) | Peak wave length (nm) on-axis (0°) | Peak wave length (nm) off-axis (45°) |
|---|---|---|---|---|---|
| 2A | REF. OLED | 7.5 | 3.3 | 528 | 523 |
| 2B | MC-OLED | 7.3 | 9.5 | 557 | 532 |

It can be seen from the Table 2 that the REF. OLED, device 2A, and the MC-OLED, device 2B have approximately same drive voltage. The device 2A exhibits insignificant angular characteristic. The shift of peak wave length was only −5 nm (deviation of 5 nm toward low wave length side) when the viewing angle was changed from on-axis to 45 degree off-axis. The device 2B on the other hand exhibits significantly enhanced on-axis luminance. However, the shift of the peak emission wave length with viewing angle, being −25 nm at relatively low angle of 45 degree appears too severe to manage. To make the viewing characteristic comparable to that of the device 2A drastic changes in MC-OLED device architecture have to be implemented. The manufacturing steps are necessarily elaborate, and the complexity in the process is almost sure to increase production cost and reduce yield. Furthermore, these changes are believed to significantly neutralize the efficiency advantage of the MC-OLED device.

Example 2

A device of the present invention, Inventive OLED, device 3C, was fabricated on glass substrate having a pure Ag anode layer. This device has a semitransparent Yb cathode and was provided with a LTL of ITO on the Yb layer. The device has the following layer structure:

3 C: Glass (1.1 mm)/Ag (80 nm)/MoO$_x$ (2.5 nm)/NPB (45 nm)/Alq (60 nm)/Li (0.5 nm)/Yb (20 nm)/ITO (32 nm)—(PR040820-1C)

The performance including angular characteristic of the device 3C is presented in Table 3 along with that of the REF. OLED, device 2A, of Table 2.

TABLE 3

| Device | Device Type | Drive voltage (V) | Efficiency (cd/A) on-axis (0°) | Peak wave length (nm) on-axis (0°) | Peak wave length (nm) off-axis (60°) |
|---|---|---|---|---|---|
| 2A | REF. OLED | 7.5 | 3.3 | 528 | 523 |
| 3C | Inventive OLED | 6.8 | 3.3 | 525 | 526 |

It can be seen from Table 3 that the REF. OLED, device 2A, and the Inventive OLED, device 3C, have same luminance. The device 3C has slightly lower drive voltage compared to the device 2A. This might be due to higher hole injection efficiency of the Ag/MoO$_x$ anode structure of device 3C compared to the ITO/CF$_x$ anode structure of device 2A. The emission wavelength of both of the devices is same within the uncertainty of measurement. The remarkable feature of the device 3C is that, unlike MC-OLED, device 2B of Table 2, the peak emission wave length shifts only by 1 nm (1 nm toward long wave length side) when the viewing angle deviates from on-axis to 60 degree off-axis. Under the same condition the wave length shift for the device 2A is −5 nm. The shift of wave length with viewing angle for both devices, devices 2A and 3C are negligible and within the uncertainty of measurement. Thus the angular characteristic of the Inventive OLED, device 3C, is significantly superior to that of the MC-OLED, device 2B, and is virtually identical to the REF. OLED, device 2A.

Example 3

A series of OLEDs, devices 4A through 4D, was made with varying thickness of a conductive LTL of sputtered ITO. The Li and the Yb layers were fixed and the conductive ITO layer on the Yb was varied. Thus the cathode structure comprising the Li, Yb and ITO was varied in this series. All other layers of all these devices were identical. The devices have the following layer structure:

Glass (1.1 mm)/Ag (80 nm)/MoO$_x$ (2.5 nm)/NPB (45 nm)/Alq (60 nm)/Li (0.5 nm)/Yb (20 nm)/ITO (varying)—(PR0400817-1)

The performance including angular characteristic of the devices 4A through 4D is presented in Table 4.

TABLE 4

| Device | ITO thickness (nm) | Drive voltage (V) | Efficiency (cd/A) on-axis (0°) | Peak wave length (nm) on-axis (0°) | Peak wave length (nm) off-axis (60°) |
|---|---|---|---|---|---|
| 4A | 0 | 7.4 | 2.3 | 542 | 532 |
| 4C | 42 | 7.2 | 4.2 | 527 | 527 |
| 4B | 70 | 7.5 | 5.1 | 544 | 503 |
| 4D | 98 | 7.5 | 3.3 | 561 | 523 |

It was believed that the lateral conductivity of cathode structure and the device voltage would improve upon application of the ITO layer. The drive voltage of these OLEDs, devices 4A through 4D, is same within uncertainty of measurement. Since the conductivity of ITO layer is believed considerably less than that of the Yb layer the improvement in lateral conductivity was probably not significant. However, it was unexpectedly discovered that the ITO layer has affected the angular characteristic of the devices. It can be seen from the Table 4 that the angular characteristics and efficiency of the devices varied as the ITO thickness changed. The device 4A having no ITO layer exhibits low efficiency and significant emission wave length shift with viewing angle. Upon application of an ITO layer, 42 nm thick, as in the device 4C, the efficiency and angular characteristic improved. The emission wave length of the device 4C did not change when the viewing angle was changed from on-axis to 60 degree off-axis. Increasing the ITO thickness significantly beyond 42 nm caused degradation of the angular characteristics. Thus, the conductive LTL in the cathode structure has profound influence on the angular characteristic, and its thickness can be selected to essentially eliminate the angular dependence of emission wave length.

Example 4

A series of OLEDs, devices 5C through 5F, was made with varying thickness of a non-conductive LTL of evaporated Alq. The Li and the Yb layers were fixed and the Alq layer on the Yb was varied. Thus the cathode structure including the Li, Yb and Alq was varied in this series. All other layers for all of these devices were identical. The devices have the following layer structure:

Glass (1.1 mm)/Ag (80 nm)/MoO$_x$ (2.5 nm)/NPB (55 nm)/Alq (60 nm)/Li (0.5 nm)/Yb (20 nm)/Alq (varying)—(PR0400817-1)

The performance including angular characteristic of the devices 5C through 5F is presented in Table 5

TABLE 2

(PR040825-1)

| Device | Alq AA thickness (nm) | Drive voltage (V) | Efficiency (cd/A) on-axis (0°) | Peak wave length (nm) on-axis (0°) | Peak wave length (nm) off-axis (60°) |
|---|---|---|---|---|---|
| 5C | 0 | 7.0 | 2.1 | 562 | 540 |
| 5D | 20 | 6.9 | 2.4 | 552 | 541 |
| 5E | 40 | 6.9 | 3.3 | 541 | 540 |
| 5F | 60 | 6.8 | 4.4 | 543 | 530 |

It was believed that the lateral conductivity of cathode structure and the device voltage would not improve upon application of the Alq layer as Alq is non-conductive. The drive voltage of these OLEDs, devices 5C through 5F, is same within uncertainty of measurement. It was unexpectedly discovered that the Alq layer affected the angular characteristic of the devices. It can be seen from the Table 5 that the angular characteristics and efficiency of the devices changed as the Alq thickness was varied. The device 5C having no Alq layer exhibits low efficiency and significant emission wave length shift with viewing angle. Upon application of Alq layer the device efficiency and angular dependence improved. The emission wave length of the device 5E remained virtually unchanged when the viewing angle was changed from on-axis to 60 degree off-axis. Increasing the Alq thickness significantly beyond 40 nm caused degradation of the angular characteristics. Thus, the nonconductive LTL in the cathode structure has profound influence on the angular characteristic, and its thickness can be selected to essentially eliminate the angular dependence of emission wave length.

Example 6

A series of OLEDs, devices 6A, 6B and 6F, was made with varying thickness of the organic layer. The NPB layer thickness was varied keeping all other layers fixed. The LTL used in this experiment was an ITO layer 38 nm thick. The devices have the following layer structures:

Glass (1.1 mm)/Ag (80 nm)/MoO$_x$ (2.5 nm)/NPB (vary)/Alq (60 nm)/Li (0.5 nm)/Yb (20 nm)/ITO (38)—(PR0400823-1)

The performance including angular characteristic of the devices 6A, 6B and 6F is presented in Table 6.

TABLE 6

(PR040823-1)

| Device | NPB thickness (nm) | Drive voltage (V) | Efficiency (cd/A) on-axis (0°) | Peak wave length (nm) on-axis (0°) | Peak wave length (nm) off-axis (60°) |
|---|---|---|---|---|---|
| 6A | 35 | 6.3 | 2.1 | 504 | 518 |
| 6B | 45 | 6.7 | 3.1 | 513 | 522 |
| 6F | 55 | 7.1 | 3.4 | 530 | 530 |

It can be easily seen, as expected, that the voltage is higher for devices having increased thickness of the NPB layer. The luminance level increased with NPB thickness in this range. But luminance dependence on NPB thickness for these devices is believed not as severe as that for the MC-OLED of Table 2. The MC-OLED is a strong microcavity device because both the electrodes are constituted of Ag, which is a highly reflective metal. The OLEDs of the present invention having Yb in the cathode structure are believed to be weak microcavity devices. The shift of emission wavelength with viewing angle although found dependent on the NPB thickness in these OLEDs, the angular dependence is not very severe. The emission from the device 6F remained unchanged when the viewing angle was changed from on-axis to 60 degree off-axis. For thinner NPB devices, devices 6A and 6B, the shift, contrary to expectation, is in the direction to the long wavelength side. Microcavity devices typically exhibit wave length shift toward shorter wave length. It is believed the angular dependence of thinner NPB devices, devices 6A and 6B, can be reduced by properly selecting the thicknesses of the ITO LTL.

Example 7

Figure 2A:
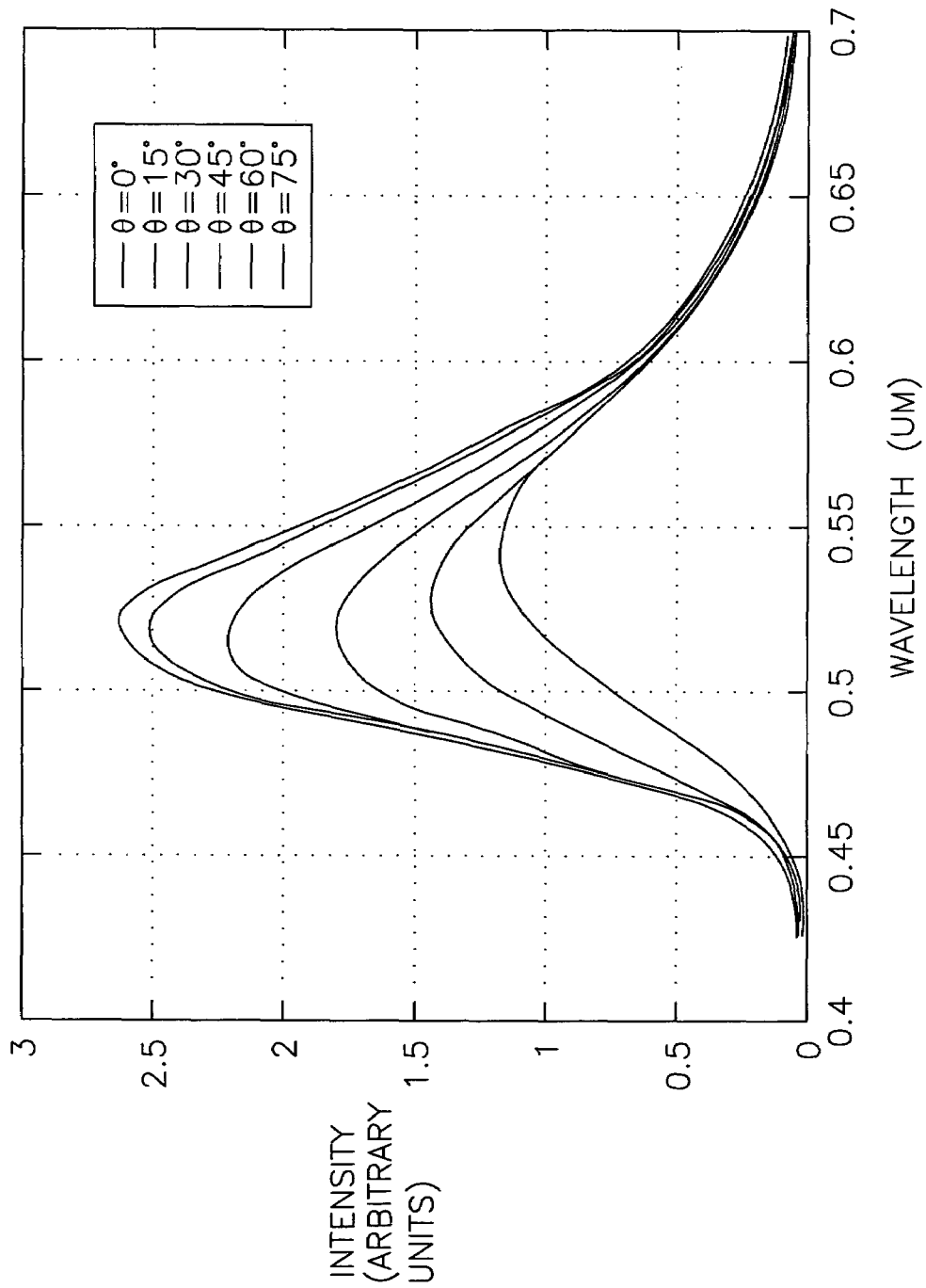
FIG. 2a shows the angular dependence of emission, as determined by modeling, of an OLED having the following structure: Glass (1.1 mm)/Ag (80 nm)/MoO$_x$ (2.5 nm)/NPB (45 nm)/Alq (60 nm)/Li (0.5 nm)/Yb (20 nm)/ITO (40 nm)
Figure 2B:
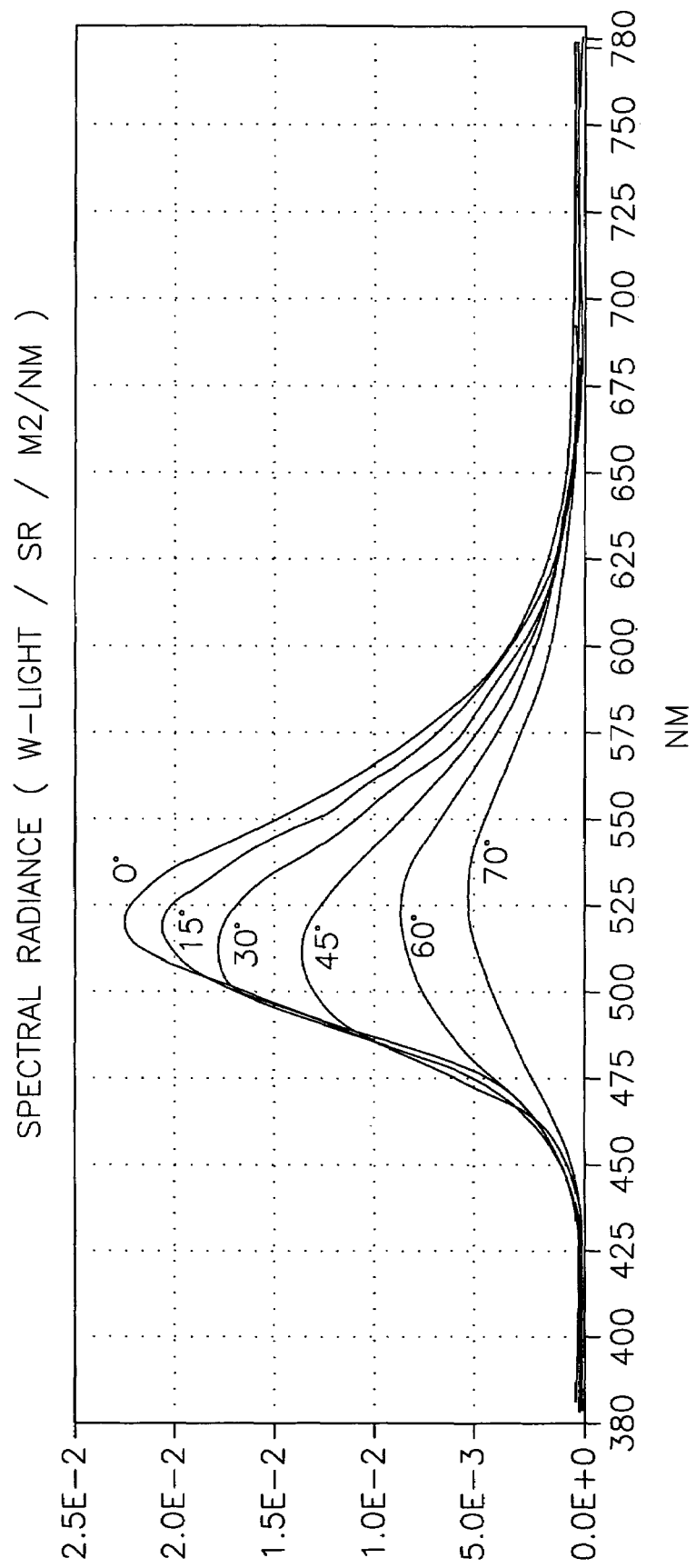

Angular dependence of emission from the device 4C (Table 4) as determined by optical modeling and by actual measurements is presented in FIG. 2a and FIG. 2b, respectively. In the modeling the presence of layers of $MoO_x$ and Li, being negligibly thin, is not taken into account. The optical indices of Yb used in the modeling were taken from the book "Handbook of Optical Constants of Solids III" ed. Edward D. Palik, Academic Press (1998). The optical constants of other materials were determined in the laboratory from auxiliary measurements. It can be seen from FIG. 2a that the emission wave length is predicted to shift by about −5 nm if the viewing angle is changed from 0 to 45 degree. The actual data shown in FIG. 2b reveal that a wavelength shift of −8 nm has occurred. It can also be seen from modeling data of FIG. 2a and from actual data of FIG. 2b that at higher angles the emission wave length shifts slightly toward the long-wave length side. The origin of this shift is not understood. It is believed the angular shift is small and manageable. It appears that the modeling can predict the angular dependence reasonably well.

Example 8

Figure 3A:
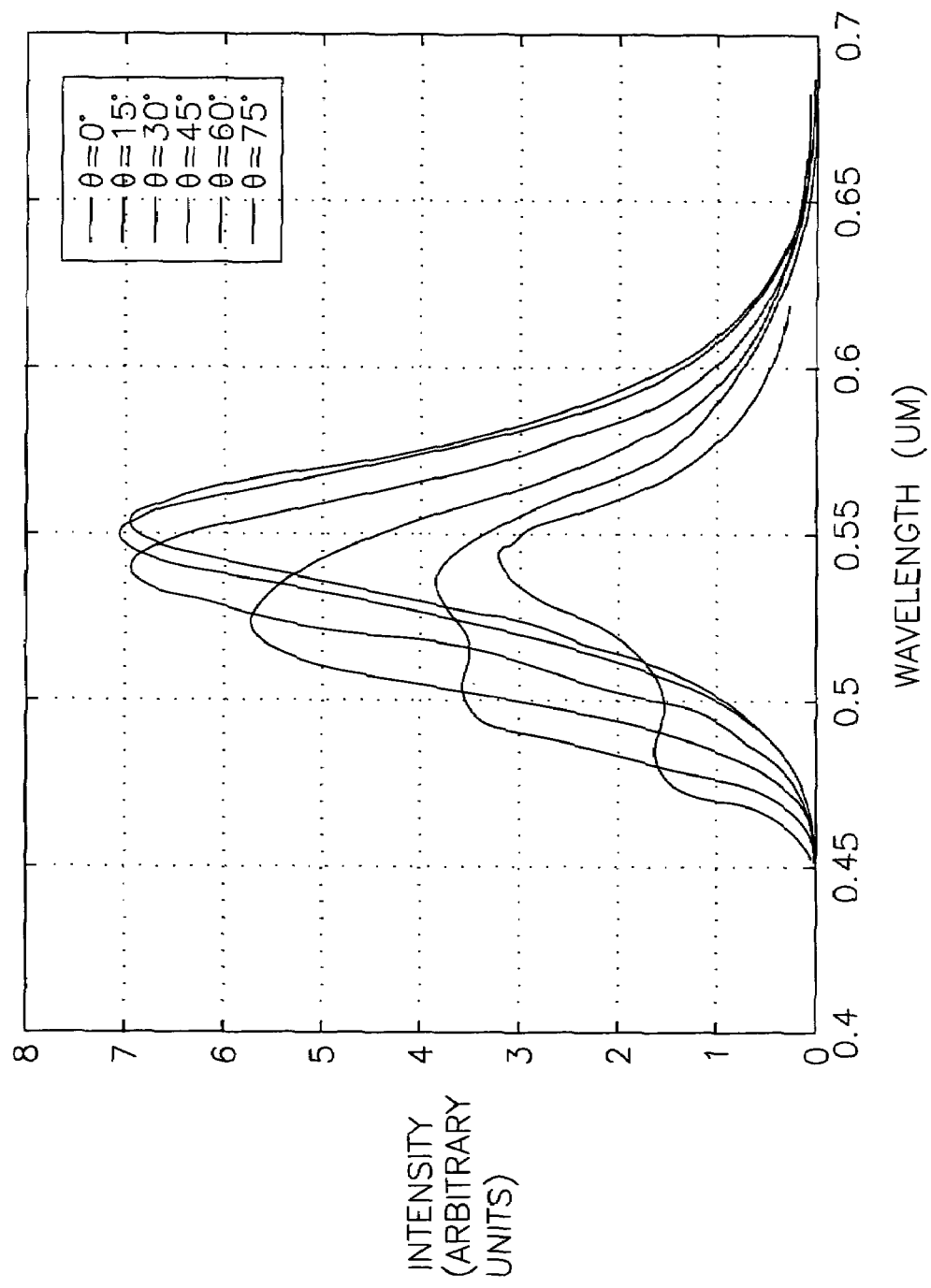
FIG. 3a shows the angular dependence of emission, as determined by modeling, of an OLED having the following structure: Glass (1.1 mm)/Ag (80 nm)/MoO$_x$ (2.5 nm)/NPB (45 nm)/Alq (60 nm)/Li (0.5 nm)/Ag (20 nm)/Alq (80 nm)
Figure 3B:
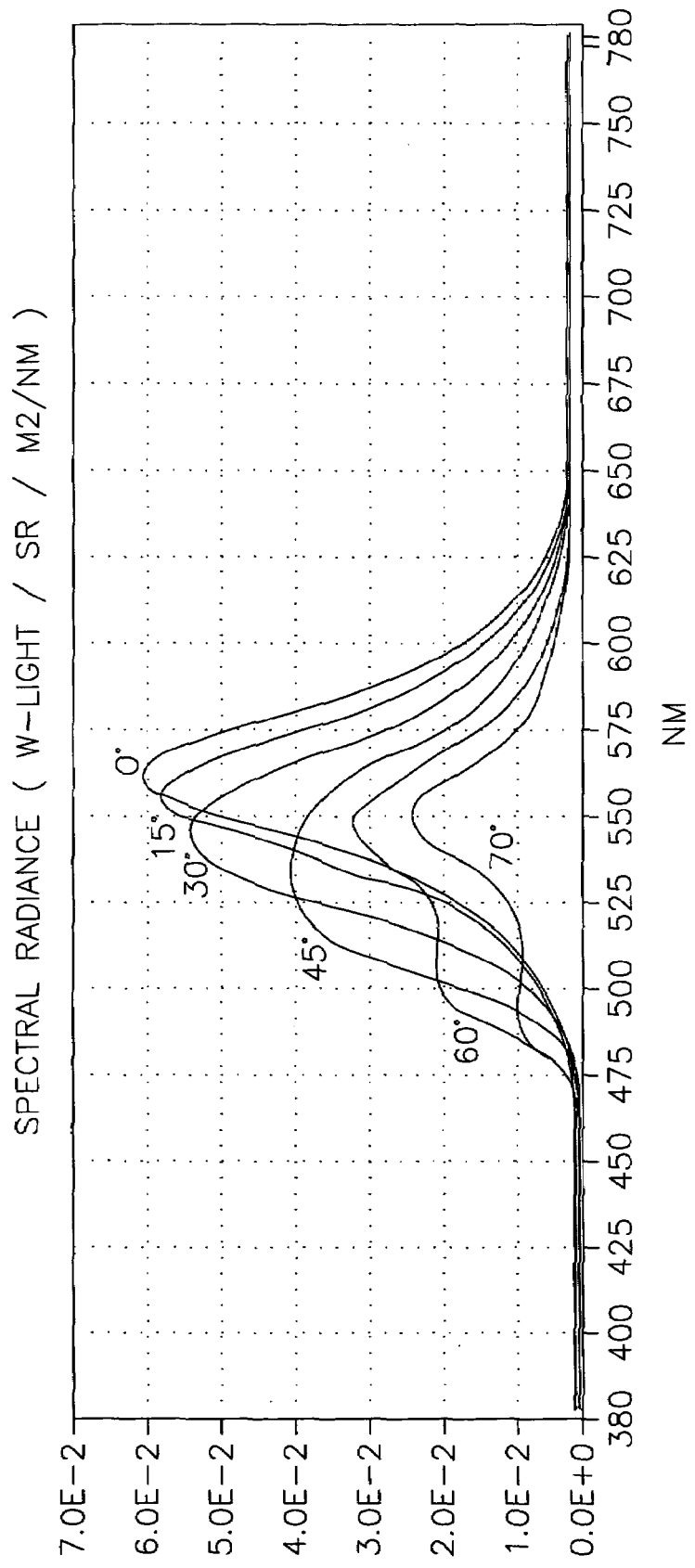

Angular dependence of emission from the device 2B as determined by optical modeling and by actual measurements is presented in FIG. 3a and FIG. 3b, respectively. Here again the presence of layers of $MoO_x$ and Li is not taken into account. According to the model a shift of −30 nm is expected at 45 degree. The experimental data show that a shift of −25 nm resulted when the angle is changed from on-axis to 45 degree off-axis. At higher angle the emission wave length is believed to shift further toward the shorter wave length side. But at higher than 45 degree the shift can not be determined with certainty because of the appearance a second peak in the spectrum. Both the modeling and the experiments show very similar characteristics. Thus, it is believed that the modeling can predict the angular dependence and spectral distribution reasonably well.

Example 9

Figure 4:
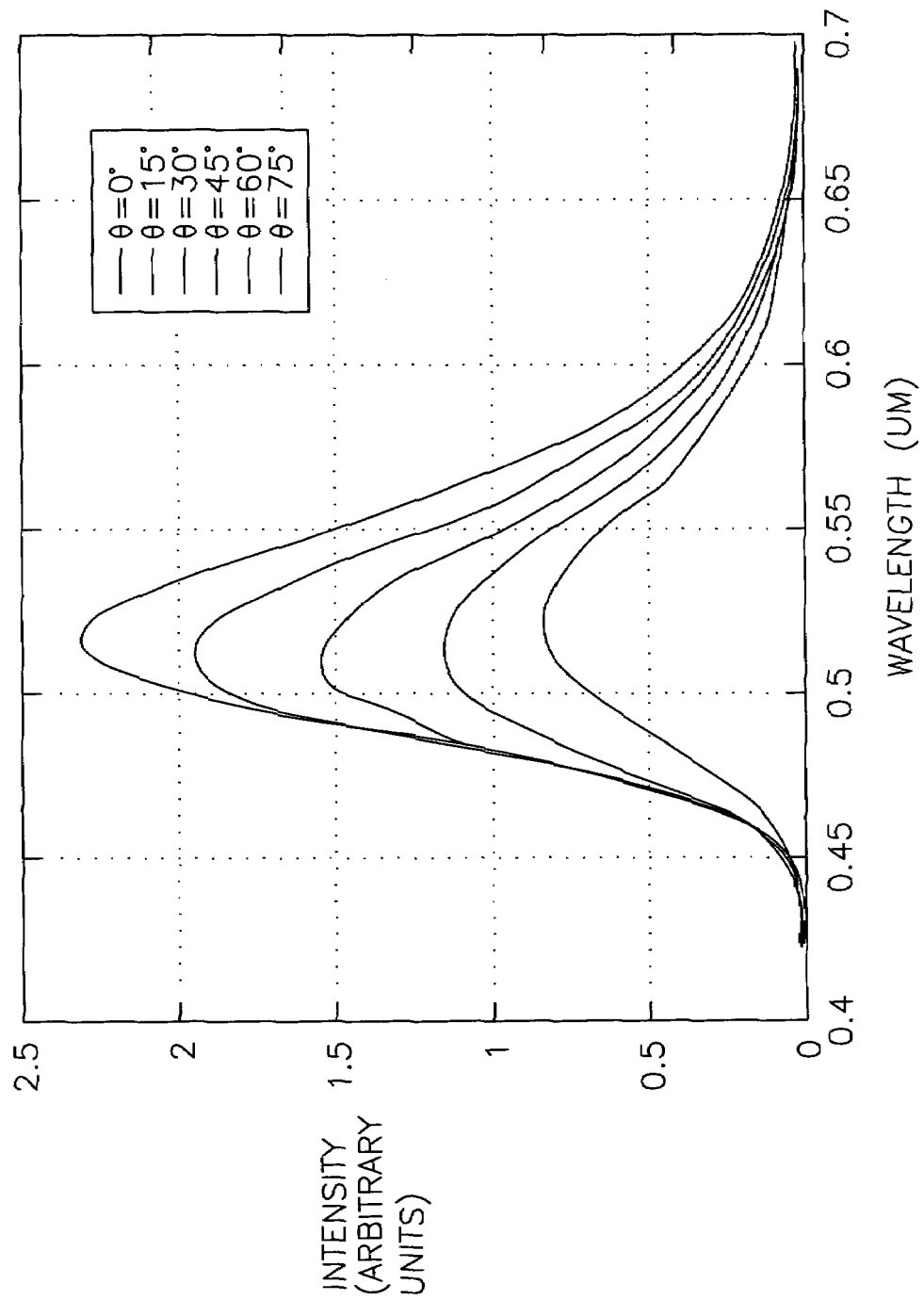
FIG. 4 shows the angular dependence of emission, as determined by modeling, of an OLED having the following structure: Glass (1.1 mm)/Ag (80 nm)/MoO$_x$ (2.5 nm)/NPB (45 nm)/Alq (60 nm)/Li (0.5 nm)/Ti (20 nm)/ITO (40 nm)

The emission as a function of viewing angle was determined by modeling for the device structure: Glass (1.1 mm)/Ag (80 nm)/$MoO_x$ (2.5 nm)/NPB (45 nm)/Alq (60 nm)/Li (0.5 nm)/Ti (20 nm)/ITO (42 nm) and is shown in FIG. 4. Here again the presence of layers of $MoO_x$ and Li is not taken into account. This modeled structure is identical to that of the device 4C of Table 4, except that Ti has replaced Yb in the cathode structure of the device 4C. At a viewing angle of 60 degree the emission wave length shift, according to FIG. 4, is small, being only about −2 nm. FIG. 4 also shows that the modeled spectrum at various viewing angles is very similar to that in the FIG. 2a, which is a plot by modeling with Yb in the cathode structure. It is thus believed that Ti (which is a low reflectivity metal) cathode can yield result very similar to that of the Yb cathode Example 10

Figure 5:
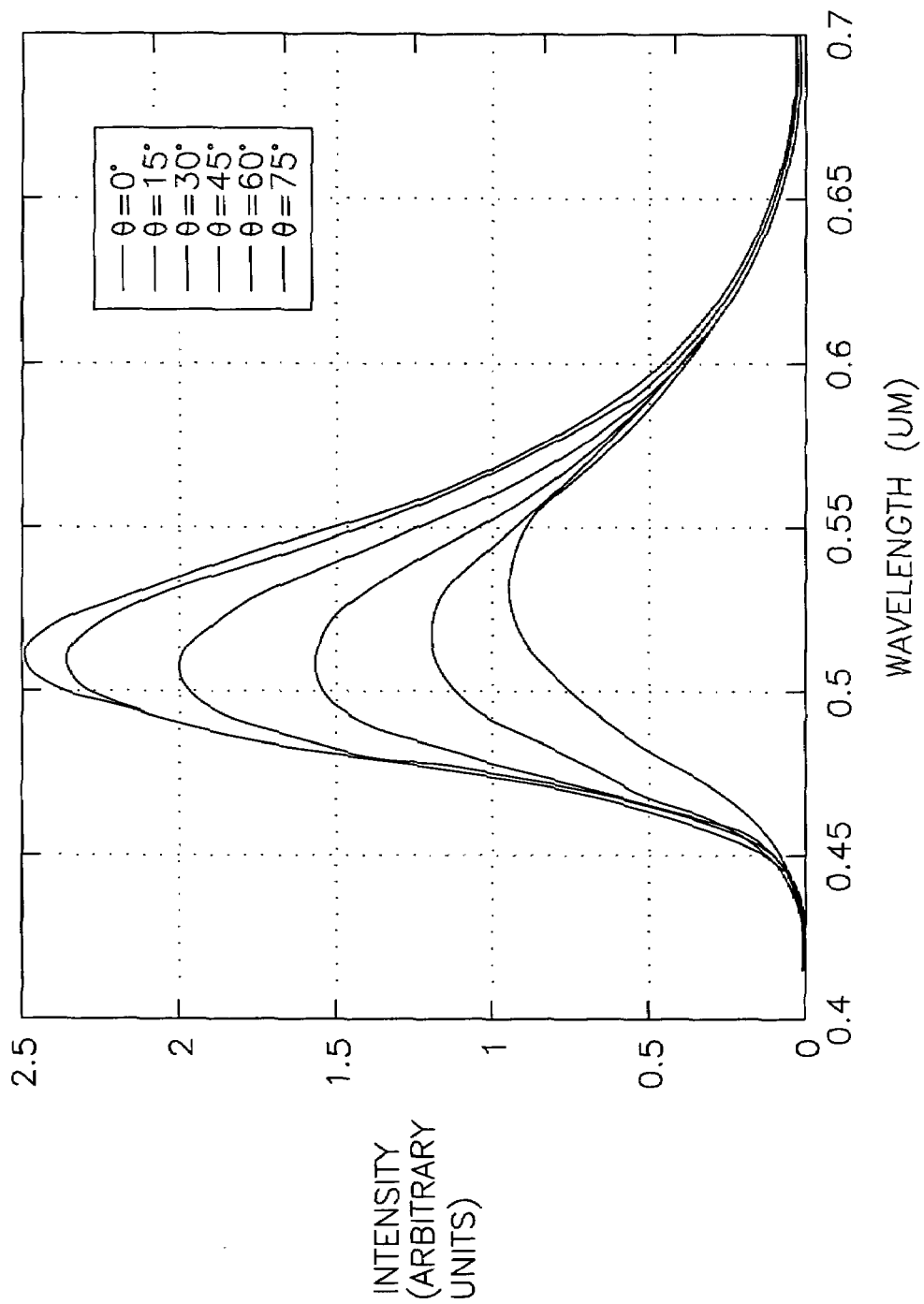
FIG. 5 shows the angular dependence of emission, as determined by modeling, of an OLED having the following structure: Glass (1.1 mm)/Ag (80 nm)/MoO$_x$ (2.5 nm)/NPB (45 nm)/Alq (60 nm)/Li (0.5 nm)/Zr (20 nm)/ITO (40 nm).

The emission as a function of viewing angle was determined by modeling for the device structure: Glass (1.1 mm)/Ag (80 nm)/$MoO_x$ (2.5 nm)/NPB (45 nm)/Alq (60 nm)/Li (0.5 nm)/Zr (20 nm)/ITO (42 nm) and is shown in FIG. 5. Here again the presence of layers of $MoO_x$ and Li are not taken into account. This modeled structure is almost identical to that of the device 4C of Table 4, except that Yb in the cathode structure of the device 4C has been replaced by Zr, which is also a low reflectivity metal. At a viewing angle of 60 degree the shift, according to FIG. 4 is small, being only about +2 nm. The FIG. 5 also shows that the modeled spectrum at various viewing angles is very similar to that in the FIG. 2a, which is a plot by modeling with Yb in the cathode structure. It is believed that Zr cathode can yield result very similar to that of the Yb cathode The data given in all the examples show that when a semitransparent cathode structure including a low reflectivity metal and a light-transmissive material, conductive or non-conductive, is selected the emission through the cathode and the angular dependence of emission through the top surface of OLED can be comparable to those of a bottom emitting OLED that employs a highly transparent anode.

The invention has been described in detail with particular reference to certain preferred embodiments thereof, but it will be understood that variations and modifications can be effected within the spirit and scope of the invention.

PARTS LIST

100 Top-emitting organic light-emitting diode
101 Transparent or opaque substrate
102 Reflective, opaque and conductive anode
103 Hole-injection layer
104 Hole-transport layer
105 Emissive Layer
106 Electron-transport layer
107 Semitransparent, low reflectivity and conductive cathode structure
108 Light transmissive layer
1071 Electron injection layer
1072 Low reflectivity, semitransparent metal layer

The invention claimed is:

1. A top-emitting OLED device with improved off-axis viewing comprising:
 (a) a substrate;
 (b) a reflective, substantially opaque, and conductive anode including a metal or metal alloy or both formed over the substrate;
 (c) at least one organic layer formed over the anode and including an electroluminescent material;
 (d) a cathode including a semitransparent metallic layer provided over the organic layer wherein the semitransparent metallic layer is a low reflectivity metal or metal alloy having a bulk reflectivity of about 50% or less; and
 (e) a light transmissive layer provided over the cathode.

2. The top-emitting OLED device with improved off-axis viewing of claim 1 wherein the cathode includes a rare earth metal, Ge, Os, Rh, Se, Si, Ta, Ti, V, W or Zr or alloys thereof.

3. The top-emitting OLED device with improved off-axis viewing of claim 2 wherein the rare earth metal includes a lanthanide.

4. The top-emitting OLED device with improved off-axis viewing of claim 3 wherein the lanthanide is Yb.

5. The top-emitting OLED device with improved off-axis viewing of claim 1 wherein the cathode includes a thin layer of an alkali metal or an alkaline earth metal under the semitransparent metallic layer.

6. The top-emitting OLED device with improved off-axis viewing of claim 5 wherein the alkali metal is Li.

7. The top-emitting OLED device with improved off-axis viewing of claim 1 wherein the cathode includes an ultrathin electron injecting layer greater than 0 and less than 2 nm between the organic layer and the semitransparent metallic layer.

8. The top-emitting OLED device with improved off-axis viewing of claim 1 wherein the thickness of the semitransparent metallic layer is in a range of 5 to 50 nm.

9. The top-emitting OLED device with improved off-axis viewing of claim 1 wherein the light transmissive layer includes highly transparent materials in a single or a multilayer structure.

10. The top-emitting OLED device with improved off-axis viewing of claim 1 wherein the light transmissive layer includes conducting or non-conducting materials.

11. The top-emitting OLED device with improved off-axis viewing of claim 1, wherein the light transmissive layer is in contact with the semitransparent metallic layer.

12. The top-emitting OLED device with improved off-axis viewing of claim 1 wherein the light transmissive layer includes metal oxides, metal nitrides, metal fluorides, metal carbides or metal borides or mixtures thereof.

13. The top-emitting OLED device with improved off-axis viewing of claim 12 wherein the light transmissive layer includes organic materials.

14. The top-emitting OLED device with improved off-axis viewing of claim 13 wherein the organic materials includes Alq or NPB or both.

15. The top-emitting OLED device with improved off-axis viewing of claim 1 wherein the reflective, substantially opaque, and conductive anode includes Ag, Al, Mg, Zn, Rh, Ru, Ir, Au, Cu, Pd, Ni, Cr, Pt, Co, Te, Mo, Hf, Fe, Mn, Nb, Ge, Os, Ti, V or W, or alloys or mixtures thereof.

16. The top-emitting OLED device with improved off-axis viewing of claim 1 wherein the thickness of the light transmissive element is a range from 5 nm to 60 nm.

17. The top-emitting OLED device with improved off-axis viewing of claim 1 further including a hole injection layer and a hole transport layer: the hole injection layer is in contact with the anode and the hole transport layer being disposed over the hole injection layer.

18. The top-emitting OLED device with improved off-axis viewing of claim 17 wherein the hole injection layer includes $CF_x$, ITO, IZO, $Pr_2O_3$, $TeO_2$, CuPc, $SiO_2$, $VO_x$, $MoO_x$, or $Ru_2O_3$ or mixtures thereof.

19. The top-emitting OLED device with improved off-axis viewing of claim 17 wherein the hole transport layer is NPB.

20. The top-emitting OLED device with improved off-axis viewing of claim 17 wherein the thickness of the hole-transport layer is 30 to 80 nm or 160 to 230 nm.

21. The top-emitting OLED device with improved off-axis viewing of claim 1 wherein the total thickness of organic layers is 90 to 140 nm or 220 to 290 nm.

22. The top-emitting OLED device with improved off-axis viewing of claim 1 wherein the thickness of anode is in a range of from 50 nm to 200 nm.

23. The top-emitting OLED device with improved off-axis viewing of claim 1 wherein the thickness of the light transmissive layer is selected to improve luminance efficiency and reduce off-axis color shift.

\* \* \* \* \*